United States Patent
Forbes et al.

(10) Patent No.: US 6,249,020 B1
(45) Date of Patent: *Jun. 19, 2001

(54) DEAPROM AND TRANSISTOR WITH GALLIUM NITRIDE OR GALLIUM ALUMINUM NITRIDE GATE

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/141,392

(22) Filed: Aug. 27, 1998

Related U.S. Application Data

(62) Division of application No. 08/902,098, filed on Jul. 29, 1997, now Pat. No. 6,031,263.

(51) Int. Cl.$^7$ .................................................. H01L 29/06
(52) U.S. Cl. ..................... 257/315; 257/296; 257/306; 257/318; 257/393; 257/407
(58) Field of Search ........................... 257/315, 296, 257/393, 318, 306, 24, 314, 320, 310, 407, 532; 438/201, 210, 211, 207, 257

(56) References Cited

U.S. PATENT DOCUMENTS

| | | | |
|---|---|---|---|
| 4,460,670 | 7/1984 | Ogawa et al. | 430/57 |
| 4,462,150 | 7/1984 | Nishimura et al. | 29/576 |
| 4,507,673 | 3/1985 | Aoyama et al. | 357/23 R |
| 4,657,699 | 4/1987 | Nair | 252/513 |
| 4,738,729 | 4/1988 | Yoshida et al. | 136/258 |
| 4,768,072 | 8/1988 | Seki et al. | 357/29 |

(List continued on next page.)

FOREIGN PATENT DOCUMENTS

| | | | |
|---|---|---|---|
| 000681333A1 | * 8/1995 | (EP) . | |
| 60-184681 | 9/1985 | (JP) | C23C/16/30 |
| 60-242678 | 12/1985 | (JP) | H01L/29/73 |
| 3-222367 | 10/1991 | (JP) | H01L/29/784 |
| 6-224431 | 8/1994 | (JP) | H01L/29/784 |
| 6-302828 | 10/1994 | (JP) | H01L/29/788 |
| 8-255878 | 10/1996 | (JP) | H01L/27/10 |

OTHER PUBLICATIONS

Beltram, F., et al., "GaAlAs/GaAs Floating–Gate Memory Devices with Graded–Gap Injector Grown by Molecular–Beam Epitaxy", *IEEE Transactions on Electron Devices*, 35, Abstract No. VA–7, 2451, (Dec. 1988).

Lin, B.J., et al., "Dramatic Reduction of Sidegating in MODFET's", *IEEE Transactions on Electron Devices*, 35, Abstract No. VA–6, 2451, (Dec. 1988).

(List continued on next page.)

*Primary Examiner*—Donald L. Monin, Jr.
*Assistant Examiner*—Mike Dietrich
(74) *Attorney, Agent, or Firm*—Schwegman, Lundberg, Woessner & Kluth, P.A.

(57) ABSTRACT

A floating gate transistor has a reduced barrier energy at an interface between a gallium nitride (GaN) or gallium aluminum nitride (GaAlN) floating gate an adjacent gate insulator, allowing faster charge transfer across the gate insulator at lower voltages. Data is stored as charge on the floating gate. The data charge retention time on the floating gate is reduced. The data stored on the floating gate is dynamically refreshed. The floating gate transistor provides a dense and planar dynamic electrically alterable and programmable read only memory (DEAPROM) cell adapted for uses such as for a dynamic random access memory (DRAM) or a dynamically refreshed flash EEPROM memory. The floating gate transistor provides a high gain memory cell and low voltage operation.

37 Claims, 7 Drawing Sheets

U.S. PATENT DOCUMENTS

| | | | |
|---|---|---|---|
| 4,769,686 | 9/1988 | Horiuchi et al. | 357/23.8 |
| 4,893,273 | 1/1990 | Usami | 365/185 |
| 5,111,430 | 5/1992 | Morie | 365/185 |
| 5,145,741 | 9/1992 | Quick | 428/402 |
| 5,260,593 * | 11/1993 | Lee | 257/316 |
| 5,293,560 | 3/1994 | Harari | 365/185 |
| 5,298,796 | 3/1994 | Tawel | 307/201 |
| 5,369,040 | 11/1994 | Halvis et al. | 437/3 |
| 5,449,941 | 9/1995 | Yamazaki et al. | 257/411 |
| 5,465,249 | 11/1995 | Cooper et al. | 365/149 |
| 5,477,485 | 12/1995 | Bergemont et al. | 365/185.24 |
| 5,508,543 | 4/1996 | Hartstein et al. | 257/314 |
| 5,530,581 | 6/1996 | Cogan | 359/265 |
| 5,580,380 | 12/1996 | Liu et al. | 117/86 |
| 5,604,357 | 2/1997 | Hori | 257/24 |
| 5,623,442 | 4/1997 | Gotou et al. | 365/185.08 |
| 5,629,222 | 5/1997 | Yamazaki et al. | 438/259 |
| 5,670,790 | 9/1997 | Katoh et al. | 257/14 |
| 5,740,104 | 4/1998 | Forbes | 365/185.03 |
| 5,786,250 | 7/1998 | Wu et al. | 438/254 |
| 5,801,401 | 9/1998 | Forbes | 257/77 |
| 5,846,859 | 12/1998 | Lee | 438/253 |
| 5,886,379 | 3/1999 | Jeong | 257/319 |
| 5,907,775 | 5/1999 | Tseng | 438/261 |
| 5,912,837 * | 6/1999 | Lakhani | 365/185.02 |
| 6,075,259 | 6/2000 | Baliga | 257/77 |

OTHER PUBLICATIONS

Lott, J.A., et al., "Charge Storage in InAlAs/InGaAs/InP Floating Gate Heterostructures", *Electronics Letters,* 26, 972–973, (Jul. 5, 1990).

Mohammad, S.N., et al., "Emerging Gallium Nitride Based Devices", *Proceedings of the IEEE,* 83, 1306–1355, (Oct. 1995).

Sze, S.M., In: *Physics of Semiconductor Devices,* Wiley–Interscience, New York, p. 496–497, (1969).

Akasaki, I., et al., "Effects of AlN Buffer Layer on Crystallographic Structure and on Electrical and Optical Properties of GaN and Ga(1–x)Al(x)N [0< x (< or =) 0.4] Films Grown on Sapphire Substrate by MOVPE", *J, Crystal Growth,* 98, 209–219, (1989).

Alok, D., et al., "Electrical Properties of Thermal Oxide Grown on N–type 6H–Silicon Carbide", *Applied Physcis Letters,* 64, 2845–2846, (May 23, 1994).

Andrieux, M., et al., "Interface and Adhesion of PACVD SiC Based Films on Metals", *Supp. Le Vide: science, technique et applications,* 279, 212–214, (1996).

Bachmann, P., et al., "Influence on Surface Modifications on the Electronic Properties of CVD Diamond Films", *Diamond and Related Materials,* 5, 1378–1383, (1996).

Baglee, D., "Characteristics & Reliability of 100 Angstrom Oxides", *IEEE 22nd Annual Proc.: Reliability Physics,* Las Vegas, 152–155, (Apr. 3–5, 1984).

Beheim, G., et al., "Magnetron Plasma Etching of SiC for Microstructures", *Proc: SPIE—Integrated Optics and Microstructures III,* San Jose, CA, 82–86, (Jan. 29, 1996).

Bengtsson, S., et al., "Applications of Aluminum Nitride Films Deposited by Reactive Sputtering to Silicon–On–Insulator Materials", *Japanese J. Applied Physics,* 35, 4175–4181, (1996).

Benjamin, M., et al., "UV Photoemission Study of Heteroepitaxial AlGaN Films Grown on 6H–SiC", *Applied Surface Science,* 104/105, 455–460, (1996).

Bermudez, V., et al., "The Growth and Properties of Al and AlN Films on GaN(0001)–(1 x 1)", *J. Applied Physics,* 79, 110–119, (Jan. 1996).

Casey, H., et al., "Low Interface Trap Density for Remote Plasma Deposited SiO2 on n–type GaN", *Applied Phys. Lett.,* 68, 1850–1852, (Mar. 1996).

Chang, C., et al., "Novel Passivation Dielectrics–The Boron– or Phosphorus–Doped Hydrogenated Amorphous Silicon Carbide Films", *Journal of the Electrochemical Society,* 132, 418–422, (Feb. 1985).

Choi, J., et al., "Effect of Deposition Conditions and Pretreatments on the Microstructure of MPECVD Diamond Thin Films", *Materials Chemistry and Physics,* 45, 176–179, (1996).

Clarke, G., et al., "The Infrared Properties of Magnetron–Sputtered Diamond–Like Thin Films", *Thin Solid Films,* 280, 130–135, (1996).

Compagnini, G., et al., "Spectroscopic Characterization of Annealed Si(1–x)C(x) Films", *J. Materials Res.,* 11, 2269–2273, (Sep. 1996).

Dartnell, N., et al., "Reactive Ion Etching of Silicon Carbide (Si(x)C(1–x))", *Vacuum,* 46, 349–355, (1995).

Demichelis, F., et al., "Influence of Doping on the Structural and Optoelectronic Properties of Amorphous and Microcrystalline Silicon Carbide", *Journal of Applied Physics,* 72, 1327–1333, (Aug. 15, 1992).

Demichelis, F., et al., "Physical Properties of Undoped and Doped Microcrystalline SiC:H Deposited By PECVD", *Materials Research Society Symposium Proceedings,* 219, Anaheim, CA, 413–418, (Apr. 30–May 3, 1991).

Dipert, B., et al., "Flash Memory Goes Mainstream", *IEEE Spectrum,* 30, 48–52, (1993).

Fissel, A., et al., "Epitaxial Growth of SiC Thin Films on Si–stabilized alpha–SiC (0001) at Low Temperatures by Solid–source Molecular Beam Epitaxy", *Journal of Crystal Growth,* 154, 72–80, (1995).

Friedrichs, P., et al., "Interface Properties of Metal–Oxide–Semiconductor Structures on N–Type 6H and 4H–SiC", *J. Applied Physics,* 79, 7814–7819, (May 15, 1996).

Fujii, T., et al., "Bonding Structures in Highly Photoconductive a–SiC:H Films Deposited by Hybrid–Plasma Chemical Vapor Deposition", *Journal of Non–Crystalline Solids,* 198–200, 577–581, (1996).

Goetzberger, A., et al., *Applied Solid State Science: Advances in Materials and Device Research,* R. Wolfe, ed., Academic Press, New York, Including p. 233, (1969).

Graul, J., et al., "Growth Mechanism of Polycrystalline beta–SiC Layers on Silicon Substrate", *Applied Phys. Lett.,* 21, 67–69, (Jul. 1972).

Hamakawa, Y., et al., "Optoelectronics and Photovoltaic Applications of Microcrystalline SiC", *Materials Research Society Symposium Proceedings,* 164, Boston, MA, 291–301, (Nov. 29–Dec. 1, 1989).

He, Z., et al., "Ion–beam–assisted Deposition of Si–carbide Films", *Thin Solid Films,* 260, 32–37, (1995).

Hu, G., "Will Flash Memory Replace Hard Disk Drive?", *IEEE Electron Devices Meeting,* Session 24, (Dec. 13, 1994).

Hwang, J., et al., "High Mobility beta–SiC Epilayer Prepared by Low–pressure Rapid Thermal Chemical Vapor Deposition on a (100) Silicon Substrate", *Thin Solid Films,* 272, 4–6, (1996).

Jou, S., et al., "Electron Emission Characterization of Diamond Thin Films Grown from a Solid Carbon Source", *Thin Solid Films,* 280, 256–261, (1996).

Kothandaraman, M., et al., "Reactive Ion Etching of Trenches in 6H–SiC", *J. Electronic Materials,* 25, 875–878, (1996).

Kumbhar, A., et al., "Growth of Clean Amorphous Silicon–Carbon Alloy Films by Hot–Filament Assisted Chemical Vapor Deposition Technique", *Applied Phys. Lett,* 66, 1741–1743, (Apr. 1995).

Lakshmi, E., et al., "Interface–State Characteristics of GaN/GaAs MIS Capacitors", *Solid–State Electronics,* 25, 811–815, (1982).

Lanois, F., et al., "Angle Etch Control for Silicon Carbide Power Devices", *Applied Phys. Lett.,* 69, 236–238, (Jul. 1996).

Lau, S., et al., "Optoelectronic Properties of Highly Conductive Microcrystalline SiC Produced by Laser Crystallization of Amorphous SiC", *J. of Non–Crystalline Solids,* 198–200, 907–910, (1996).

Leggieri, G., et al., "Laser Ablation Deposition of Silicon Carbide Films", *Applied Surface Science,* 96–98, 866–869, (1996).

Lei, T., et al., "Epitaxial Growth and Characterization of Zinc–Blende Gallium Nitride on (001) Silicon", *J. Appl. Phys.,* 71, 4933–4943, (May 1992).

Liu, J., et al., "Formation of SiC Films on Silicon Field Emitters", *Materials Res. Soc. Symp. Proc.,* 311, San Francisco, CA, (Apr. 13–15, 1993).

Liu, J., et al., "Modification of Si Field Emitter Surfaces by Chemical Conversion to SiC", *J. Vac. Sci. Technology,* B 12, 717–721, (1994).

Luo, J., et al., "Localized Epitaxial Growth of Hexagonal and Cubic SiC Films on Si by Vacuum Annealing", *Applied Phys. Lett.,* 69, 916–918, (Aug. 1996).

Martins, R., et al., "Transport Properties of Doped Silicon Oxycarbide Microcrystalline Films Produced by Spatial Separation Techniques", *Solar Energy Materials and Solar Cells,* 41–42, 493–517, (1996).

Martins, R., et al., "Wide Band Gap Microcrystalline Silicon Thin Films", *Diffusion and Defect Data : Solid State Phenomena,* 44–46, Part 1, Scitec Publications, 299–346, (1995).

Maury, F., et al., "Chemical Vapor Co–Deposition of C and SiC at Moderate Temperature for the Synthesis of Compositionally Modulated Si(x)C(1–x) Ceramic Layers", *Surface and Coatings Technology,* 76–77, 119–125, (1995).

McLane, G., et al., "High Etch Rates of SiC in Magnetron Enhanced SF(6) Plasmas", *Applied Phys. Lett.,* 68, 3755–3757, (Jun. 1996).

Mogab, C., et al., "Conversion of Si to Epitaxial SiC by Reaction with C(2)H(2)", *J. Applied Physics,* 45, 1075–1084, (Mar. 1974).

Molnar, R., et al., "Growth of Gallium Nitride by Electron–Cyclotron Resonance Plasma–Assisted Molecular–Beam Epitaxy: The Role of Charged Species", *J. Appl. Phys.,* 76, 4587–4595, (1994).

Muller, K., et al., "Trench Storage Node Technology for Gigabit DRAM Generations", *Digest IEEE Int. Electron Devices Meeting,* San Francisco, CA, 594–597, (Dec. 1996).

Nemanich, R., et al., "Negative Electron Affinity Surfaces of Aluminum Nitride and Diamond", *Diamond and Related Materials,* 5, 790–796, (1996).

Ouyang, M., et al., "Deposition of Diamond–Like Carbon Films via Excimer Laser Ablation of Polybutadiene", *Materials Science and Engineering,* B39, 228–231, (1996).

Pankove, J., "Photolectric Emission", In: *Optical Processes in Semiconductors,* Dover Publications Inc., New York, 287–301, (1971).

Pankove, J., et al., "Photoemission from GaN", *Applied Phys. Lett.,* 25, 53–55, (1974).

Papadas, C., et al., "Modeling of the Intrinsic Retention Charcteristics of FLOTOX EEPROM Cells Under Elevated Temperature Conditions", *IEEE Transaction on Electron Devices,* 42, 678–682, (Apr. 1995).

Patuwathavithane, C., et al., "Oxidation Studies for 6H–SiC", *Proc: 4th Int. Conf. on Amorphous and Crystalline Silicon Carbide IV,* Santa Clara, CA, 163–169, (Oct. 9–11, 1991).

Pereyra, I., et al., "Wide Gap a–Si(1–x)C(x): H Thin Films Obtained Under Starving Plasma Deposition Conditions", *J. Non–Crystalline Solids,* 201, 110–118, (1996).

Pollack, S., "Electron Transport Through Insulating Thin Films", *Appl. Solid–State Science,* 1, 345–355, (1969).

Prendergast, J., "FLASH or DRAM: Memory Choice for the Future", *IEEE Electron Device Meeting,* Session 25, Phoenix, AZ, (1995).

Rahman, M., et al., "Preparation and Electrical Properties of An Amorphous SiC/ Crystalline Si p(+)n Heterostructure", *Japanese J. Applied Physics,* 23, 515–524, (May 1984).

Renlund, G., et al., "Silicon Oxycarbide Glasses: Part I. Preparation and Chemistry", *Journal of Materials Research,* 6, 2716–2722, (Dec. 1991).

Renlund, G., et al., "Silicon Oxycarbide Glasses: Part II. Structure and Properties", *Journal of Materials Research,* 6, 2723–2734, (Dec. 1991).

Schmidt, I., et al., "Low Temperature Diamond Growth Using Fluorinated Hydrocarbons", *Diamond and Related Materials,* 5, 1318–1322, (1996).

Serre, C., et al., "Ion–Beam Synthesis of Amorphous SiC Films: Structural Analysis and Recrystallization", *J. Appl. Phys.,* 79, 6907–6913, (May 1996).

Sim, S., et al., "A New Planar Stacked Technology (PST) for Scaled and Embedded DRAMs", *Digest IEEE Int. Electron Devices Meeting,* San Francisco, CA, 504–507, (Dec. 1996).

Suzaki, Y., et al., "Quantum Size Effects of a–Si(:H)/a–SiC(:H) Multilayer Films Prepared by rf Sputtering", *Abstracts of Papers Published in the Int. J. Japenese Soc. for Precision Engineering,* 28, Abstract of Paper in vol. 60, 182, (Jun. 1994).

Svirkova, N., et al., "Deposition Conditions and Density–of–States Spectrum of a–Si(1–x)C(x) :H Films Obtained by Sputtering", *Semiconductors,* 28, 1164–1169, (Dec. 1994).

Sze, S., *Physics of Semiconductors,* 2nd Edition., John Wiley & Sons, Pub., New York, ISBN 0471056618, (1981).

Tarui, Y., "Flash Memory Features Simple Structure, Superior Integration", *JEE,* 30, 84–87, (Sep. 1993).

Tenhover, M., et al., "DC–Magnetron Sputtered Silicon Carbide", *Materials Res. Soc. Symp. Proc.,* 356, Boston, MA, 227–232, (Nov. 28–Dec. 2, 1994).

Thomas, J., et al., "Plasma Etching and Surface Analysis of a–SiC :H Films Deposited by Low Temperature Plasma Enhanced Chemical Vapor Deposition", *Materials Res. Soc. Symp. Proc.,* 334, Boston, MA, 445–450, (Nov. 29–Dec. 2, 1993).

Tiwari, S., et al., "A silicon nanocrystal based memory", *Appl. Physics Lett.,* 68, 1377–1379, (1996).

Tiwari, S., et al., "Volatile and Non–Volatile Memories in Silicon with Nano–Crystal Storage", *Int'l Electron Devices Meeting: Technical Digest,* Washington, DC, 521–524, (Dec. 1995).

Tucker, C., et al., "Ion–beam–assisted Deposition of Non-hydrogenated a–Si:C Films", *Can. J. Physics,* 74, 97–101, (1996).

van der Weide, J., et al., "Negative–electron–affinity Effects on the Diamond (100) Surface", *Physical Review B [Condensed Matter]*, 50, 5803–5806, (Aug. 15, 1994).

Vodakov, Y., et al., "Diffusion and Solubility of Impurities in Silicon Carbide", In: *Silicon Carbide,* R.C. Marshall, et al., eds., Univ. of South Carolina Press, 508–519, (1973).

Wahab, Q., et al., "3C–SiC / Si / 3C–SiC Epitaxial Trilayer Films Deposited on Si (111) Substrates by Reactive Megnetron Sputtering", *J. Materials Res.,* 10, 1349–1351, (Jun. 1995).

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films,* 274, 70–75, (1996).

Wolter, S., et al., "Textured Growth of Diamond on Silicon via in situ Carburization and Bias–Enhanced Nucleation", *Appl. Phys. Lett.,* 62, 1215–1217, (Mar. 1993).

Wu, K., et al., "The Growth and Characterization of Silicon/Silicon Carbide Heteroepitaxial Films on Silicon Substrates by Rapid Thermal Chemical Vapor Deposition", *Japanese J. Appl. Phys.,* 35, 3836–3840, (1996).

Yamaguchi, Y., et al., "Properties of Heteroepitaxial 3C–SiC Films Grown by LPCVD", *Digest of Tech. Papers: 8th Int. Conf. on Solid–State Sensors and Actuators and Eurosensors IX,* vol. 2, Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", *Proc.: Int. Symp. on Surfaces and Thin Films of Electronic Materials. Bull. of the Res. Institute of Electronics,* Shizuoka University, 30, 95–98, (1995).

Yee, A., et al., "The Effect of Nitrogen on Pulsed Laser Deposition of Amorphous Silicon Carbide Films: Properties and Structure", *J. Materials Research,* 11, 1979–1986, (1996).

Yoder, M., "Wide Bandgap Semiconductor Materials and Devices", *IEEE Transactions on Electron Devices,* 43, 1633–1636, (Oct. 1996).

* cited by examiner

DEAPROM AND TRANSISTOR WITH GALLIUM NITRIDE OR GALLIUM ALUMINUM NITRIDE GATE

This application is a division of U.S. Ser. No. 08/902, 098, filed Jul. 29, 1997 now U.S. Pat. No. 6,031,263.

FIELD OF THE INVENTION

The present invention relates generally to integrated circuit technology, including dynamic random access memories (DRAMs) and electrically erasable and programmable read only memories (EEPROMS), and particularly, but not by way of limitation, to a floating gate transistor memory that is dynamically electrically alterable and programmable.

BACKGROUND OF THE INVENTION

Dynamic random access memories (DRAMs) are data storage devices that store data as charge on a storage capacitor. A DRAM typically includes an array of memory cells. Each memory cell includes a storage capacitor and an access transistor for transferring charge to and from the storage capacitor. Each memory cell is addressed by a word line and accessed by a bit line. The word line controls the access transistor such that the access transistor controllably couples and decouples the storage capacitor to and from the bit line for writing and reading data to and from the memory cell.

The storage capacitor must have a capacitance that is large enough to retain a charge sufficient to withstand the effects of parasitic capacitances, noise due to circuit operation, and access transistor reverse-bias junction leakage currents between periodic data refreshes. Such effects can result in erroneous data. Obtaining a large capacitance typically requires a storage capacitor having a large area. However, a major goal in DRAM design is to minimize the area of a DRAM memory cell to allow cells to be more densely packed on an integrated circuit die so that more data can be stored on smaller integrated circuits.

In achieving the goal of increasing DRAM array capacity by increasing cell density, the sufficient capacitance levels of the DRAM storage capacitors must be maintained. A "stacked storage cell" design can increase the cell density to some degree. In this technique, two or more capacitor conductive plate layers, such as polycrystalline silicon (polysilicon or poly), are deposited over a memory cell access transistor on a semiconductor wafer. A high dielectric constant material is sandwiched between these capacitor plate layers. Such a capacitor structure is known as a stacked capacitor cell (STC) because the storage capacitor plates are stacked on top of the access transistor. However, formation of stacked capacitors typically requires complicated process steps. Stacked capacitors also typically increase topographical features of the integrated circuit die, making subsequent lithography and processing, such as for interconnection formation, more difficult Alternatively, storage capacitors can be formed in deep trenches in the semiconductor substrate, but such trench storage capacitors also require additional process complexity. There is a need in the art to further increase memory storage density without adding process complexity or additional topography.

Electrically erasable and programmable read only memories (EEPROMs) provide nonvolatile data storage. EEPROM memory cells typically use field-effect transistors (FETs) having an electrically isolated (floating) gate that affects conduction between source and drain regions of the FET. A gate dielectric is interposed between the floating gate and an underlying channel region between source and drain regions. A control gate is provided adjacent to the floating gate, separated therefrom by an intergate dielectric.

In such memory cells, data is represented by charge stored on the polysilicon floating gates, such as by hot electron injection or Fowler-Nordheim tunneling during a write operation. Fowler-Nordheim tunneling is typically used to remove charge from the polysilicon floating gate during an erase operation. However, the relatively large electron affinity of the polysilicon floating gate presents a relatively large tunneling barrier energy at its interface with the underlying gate dielectric. The large tunneling barrier energy provides longer data retention times than realistically needed. For example, a data charge retention time at 85° C. is estimated to be in millions of years for some floating gate memory devices. The large tunneling barrier energy also increases the voltages and time needed to store and remove charge to and from the polysilicon floating gate. "Flash" EEPROMs, which have an architecture that allows the simultaneous erasure of many floating gate transistor memory cells, require even longer erasure times to accomplish this simultaneous erasure. The large erasure voltages needed can result in hole injection into the gate dielectric. This can cause erratic overerasure, damage to the gate dielectric, and introduction of trapping states in the gate dielectric. The high electric fields hat result from the large erasure voltages can also result in reliability problems, leading to device failure. There is a need in the art to obtain floating gate transistors that allow the use of lower programming and erasure voltages and shorter programming and erasure times.

SUMMARY OF THE INVENTION

The present invention includes a memory cell that allows the use of lower programming and erasure voltages and shorter programming and erasure times by providing a gallium nitride (GaN) or gallium aluminum nitride (GaAlN) storage electrode for storing charge. According to one aspect of the invention, the storage electrode provides a barrier energy, with an adjacent insulator, of less than approximately 3.3 eV, which provides improved erase times or voltages.

In one embodiment, the memory cell includes a floating gate transistor, having a GaN or GaAlN floating gate. A refresh circuit allows dynamic refreshing of charge stored on the floating gate. The barrier energy can be lowered to a desired value by selecting the appropriate material composition of the floating gate. As a result, lower programming and erasure voltages and shorter programming and erasure times are obtained.

Another aspect of the present invention provides a method of using a floating gate transistor having a reduced barrier energy between a floating gate electrode and an adjacent insulator. Data is stored by changing the charge of the floating gate. Data is refreshed based on a data charge retention time established by the barrier energy between the GaN or GaAlN floating gate and the adjacent insulator. Data is read by detecting a conductance between a source and a drain The large transconductance gain of the memory cell of the present invention provides a more easily detected signal and reduces the required data storage capacitance value and memory cell size when compared to a conventional dynamic random access memory (DRAM) cell.

The present invention also includes a method of forming a floating gate transistor. Source and drain regions are formed A gate insulator is formed. A GaN or GaAlN floating gate is formed, such that the floating gate is isolated from conductors and semiconductors. In one embodiment, the floating gate is formed by metal organic chemical vapor deposition (MOCVD). In another embodiment, the floating gate is formed by plasma-enhanced molecular beam epitaxy (PEMBE). The GaN or GaAlN floating gate provides a relatively short data charge retention time, but advantageously provides a shorter write/programming and erase times, making operation of the present memory speed competitive with a DRAM.

The present invention also includes a memory device that is capable of providing short programming and erase times, low programming and erase voltages, and lower electric fields in the memory cell for improved reliability. The memory device includes a plurality of memory cells. Each memory cell includes a transistor. Each transistor includes a source region, a drain region, a channel region between the source and drain regions, and a GaN or GaAlN floating gate that is separated from the channel region by an insulator. The transistor also includes a control gate located adjacent to the floating gate and separated therefrom by an intergate dielectric. According to one aspect of the invention, a refresh circuit is provided. The memory device includes flash electrically erasable and programmable read only memory (EEPROM), dynamic random access memory (DRAM), and dynamically electrically alterable and programmable read only memory (DEAPROM) embodiments.

The memory cell of the present invention provides a reduced barrier energy, large transconductance gain, an easily detected signal and reduces the required data storage capacitance value and memory cell size. The lower barrier energy increases tunneling current and also advantageously reduces the voltage required for writing and erasing the floating gate transistor memory cells. For example, conventional polysilicon floating gate transistors typically require complicated and noisy on-chip charge pump circuits to generate the large erasure voltage, which typically far exceeds other voltages required on the integrated circuit The present invention allows the use of lower erasure voltages that are more easily provided by simpler on-chip circuits. Reducing the erasure voltage also lowers the electric fields, minimizing reliability problems that can lead to device failure, and better accommodating downward scaling of device dimensions. Alternatively, the thickness of the gate insulator can be increased from the typical thickness of a silicon dioxide gate insulator to improve reliability or simplify processing, since the lower barrier energy allows easier transport of charge across the gate insulator by Fowler-Nordheim tunneling.

According to another aspect of the invention, the shorter retention time of data charges on the GaN or GaAlN floating electrode, resulting from the smaller barrier energy, is accommodated by refreshing the data charges on the floating electrode. By decreasing the data charge retention time and periodically refreshing the data, the write and erase operations can be several orders of magnitude faster such that the present memory is speed competitive with a DRAM. In this respect, the memory operates similar to a memory cell in DRAM but avoids the process complexity, additional space needed, and other limitations of forming stacked or trench DRAM capacitors.

The memory cell of the present invention can be made smaller than a conventional DRAM memory cell. Moreover, because the storage capacitor of the present invention is integrally formed as part of the transistor, rather than requiring complex and costly non-CMOS stacked and trench capacitor process steps, the memory of the present invention should be cheaper to fabricate than DRAM memory cells, and should more easily scale downward as CMOS technology advances.

BRIEF DESCRIPTION OF THE DRAWINGS

In the drawings, like numerals describe substantially similar components throughout the several views.

DETAILED DESCRIPTION OF THE INVENTION

Figure 1:
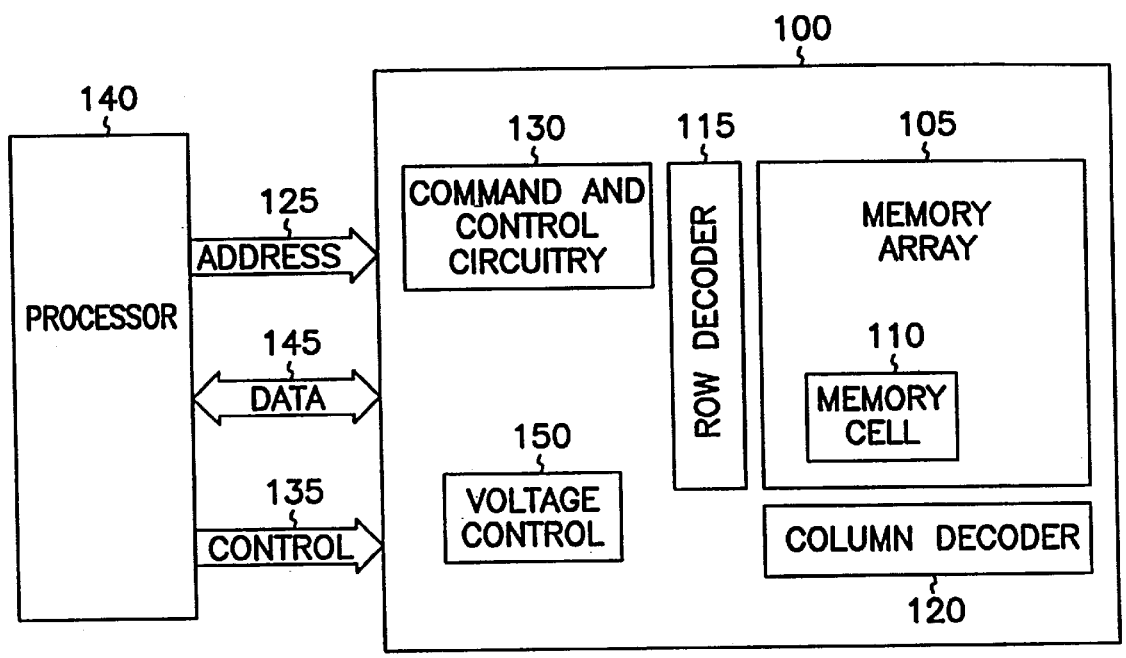
FIG. 1 is a simplified schematic/block diagram illustrating generally one embodiment of a memory including reduced barrier energy floating electrode memory cells.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims.

The present invention discloses a dynamic electrically alterable programmable read only memory (DEAPROM) cell. The memory cell has a floating electrode, which is defined as an electrode that is "electrically isolated" from conductors and semiconductors by an insulator such that charge storage upon and removal from the floating electrode depends upon charge conduction through the insulator. In one embodiment, described below, the floating electrode is a floating gate electrode in a floating gate field-effect transistor, such as used in flash electrically erasable and programmable read only memories (EEPROMs). However, a capacitor or any other structure having a floating electrode and adjacent insulator could also be used according to the techniques of the present invention described below. According to one aspect of the present invention, a barrier energy between the floating electrode and the insulator is lower than the barrier energy between polycrystalline silicon (polysilicon) and silicon dioxide ($SiO_2$), which is approximately 3.3 eV. According to another aspect of the present invention, the shorter retention time of data charges on the floating electrode, resulting from the smaller barrier energy, is accommodated by refreshing the data charges on the floating electrode. In this respect the memory operates similar to a memory cell in a dynamic random access memory (DRAM). These and other aspects of the present invention are described in more detail below.

FIG. 1 is a simplified schematic/block diagram illustrating generally one embodiment of a memory 100 according to one aspect of the present invention, in which reduced barrier energy floating electrode memory cells are incorporated. Memory 100 is referred to as a dynamic electrically alterable programmable read only memory (DEAPROM) in this application, but it is understood that memory 100 possesses certain characteristics that are similar to DRAMs and flash EEPROMs, as explained below. For a general description of how a flash EEPROM operates, see B. Dipert et al., "Flash Memory Goes Mainstream," IEEE Spectrum, pp. 48–52 (Oct. 1993), which is incorporated herein by reference. Memory 100 includes a memory array 105 of multiple memory cells 110. Row decoder 115 and column decoder 120 decode addresses provided on address lines 125 to access the addressed memory cells in memory array 105. Command and control circuitry 130 controls the operation of memory 100 in response to control signals received on control lines 135 from a processor 140 or other memory controller during read, write, refresh, and erase operations. Command and control circuitry 130 includes a refresh circuit for periodically refreshing the data stored on the memory cells 110. Voltage control 150 provides appropriate voltages to the memory cells during read, write, refresh, and erase operations. Memory 100, as illustrated in FIG. 1, has been simplified for the purpose of illustrating the present invention and is not intended to be a complete description. Only the substantial differences between DEAPROM memory 100 and conventional DRAM and flash EEPROM memories are discussed below.

Figure 2:
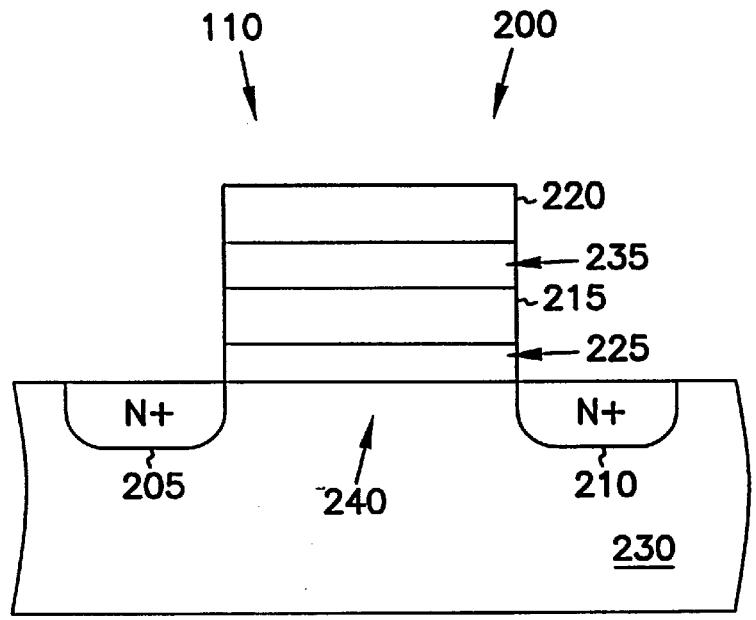
FIG. 2 is a cross-sectional view that illustrates generally a floating gate transistor embodiment of a memory cell provided by the present invention.

FIG. 2 is a cross-sectional view that illustrates generally, by way of example, but not by way of limitation, one floating gate transistor embodiment of a memory cell 110. Other structural arrangements of floating gate transistors are included within the present invention. Also included are any memory cells that incorporate a floating electrode (such as a floating electrode capacitor) having, at an interface between the floating electrode an adjacent insulator, a barrier energy that is less than the barrier energy at a polysilicon-$SiO_2$ interface. In the embodiment of FIG. 2, memory cell 110 includes a floating gate FET 200, which is illustrated as an n-channel FET, but understood to include a p-channel FET embodiment as well.

FET 200 includes a source 205, a drain 210, a floating gate 215 electrode, and a control gate 220 electrode. A gate insulator 225 is interposed between floating gate 215 and substrate 230. An intergate insulator 235 is interposed between floating gate 215 and control gate 220. In one embodiment, substrate 230 is a bulk semiconductor, such as silicon. In another embodiment, substrate 230 includes a thin semiconductor surface layer formed on an underlying insulating portion, such as in a semiconductor-on-insulator (SOI) or other thin film transistor technology. Source 205 and drain 210 are formed by conventional complementary metal-oxide-semiconductor (CMOS) processing techniques. Source 205 and drain 210 are separated by a predetermined length for forming an inversion channel 240 therebetween.

Figure 3:
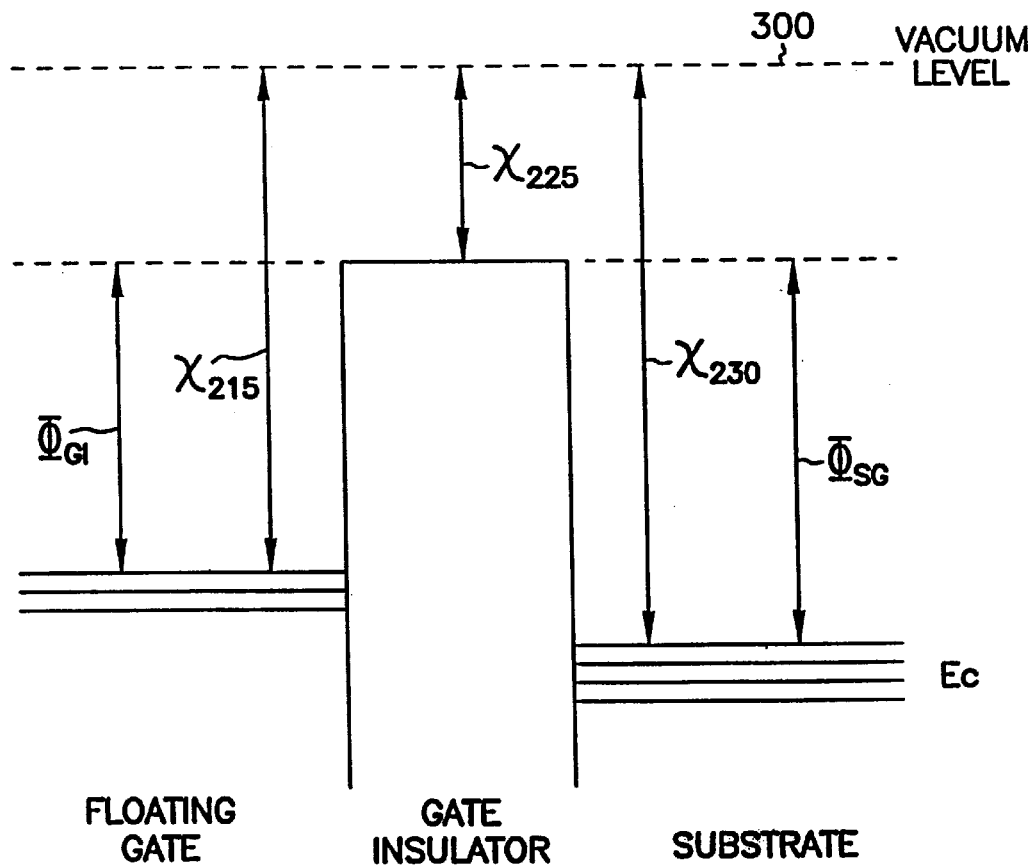
FIG. 3 is an energy band diagram that illustrates generally conduction band energy levels in a floating gate transistor provided by the present invention.

FIG. 3 is an energy band diagram that illustrates generally the conduction band energy levels in floating gate 215, gate insulator 225, and substrate 230. Electron affinities $\chi_{215}$, $\chi_{225}$ and $\chi_{230}$ describe floating gate 215, gate insulator 225, and substrate 230, respectively, when measured with respect to a vacuum level 300. A barrier energy $\Phi_{GI}$, which describes the barrier energy at the interface between floating gate 215 and gate insulator 225; is given by a difference in electron affinities, as illustrated in Equation 1.

$$\Phi_{GI}=\chi_{215}-\chi_{225} \quad (1)$$

A barrier energy, $\Phi_{SG}$, which describes the barrier energy at the interface between substrate 230 and gate insulator 225, is given by a difference in electron affinities, as illustrated in Equation 2.

$$\Phi_{SG}=\chi_{230}-\chi_{225} \quad (2)$$

Silicon (monocrystalline or polycrystalline Si) has an electron affinity $\chi_{215} \approx 4.2$ eV. Silicon dioxide ($SiO_2$) has an electron affinity, $\chi_{225}$, of about 0.9 eV. The resulting barrier energy at a conventional Si—$SiO_2$ interface between a floating gate and a gate insulator is approximately equal to 3.3 eV. One aspect of the present invention provides a barrier energy $\Phi_{GI}$ that is less than the 3.3 eV barrier energy of a conventional Si—$SiO_2$ interface.

According to one aspect of the invention, the interface between floating gate 215 and gate insulator 225 provides a smaller barrier energy $\Phi_{GI}$ than the 3.3 eV barrier energy at an interface between polysilicon and silicon dioxide, such as by an appropriate selection of the material composition of one or both of floating gate 215 and gate insulator 225. In one embodiment, the smaller barrier energy $\Phi_{GI}$ is obtained by forming floating gate 215 from a material having a smaller electron affinity $\chi_{215}$ than polysilicon. In one embodiment, for example, polycrystalline or microcrystalline silicon carbide (SiC) is used as the material for forming floating gate 215. In another embodiment, the smaller barrier energy $\Phi_{GI}$ is obtained by forming gate insulator 225 from a material having a higher electron affinity $\chi_{225}$ than $SiO_2$. In one embodiment, for example, amorphous SiC is used as the material for forming gate insulator 225. In yet another embodiment, the smaller barrier energy $\Phi_{GI}$ is obtained by a combination of forming floating gate 215 from a material having a smaller electron affinity $\chi_{215}$ than polysilicon and also forming gate insulator 225 from a material having a higher electron affinity $\chi_{225}$ than $SiO_2$.

The smaller barrier energy $\Phi_{GI}$ provides current conduction across gate insulator 225 that is easier than for a polysilicon-$SiO_2$ interface. The present invention includes any mechanism of providing such easier current conduction across gate insulator 225, including, but not limited to "hot" electron injection, thermionic emission, Schottky emission, Frenkel-Poole emission, and Fowler-Nordheim tunneling. Such techniques for transporting charge carriers across an insulator, such as gate insulator 225, are all enhanced by providing a smaller barrier energy $\Phi_{GI}$ according to the techniques of the present invention. These techniques allow increased current conduction, current conduction at lower voltages across gate insulator 225 and lower electric fields in gate insulator 225, shorter data write and erase times, use of a thicker and more reliable gate insulator 225, and other advantages explained below.

Figure 4:
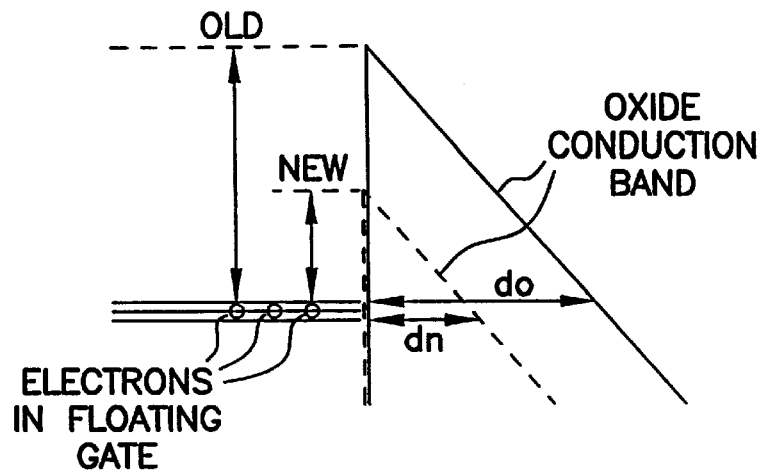
FIG. 4 is a graph comparing barrier energy vs. tunneling distance for a conventional floating gate transistor and one embodiment of a the present invention having a lower barrier energy.

FIG. 4 is a graph illustrating generally barrier energy versus tunneling distance for a conventional polysilicon-SiO$_2$ interface having a 3.3 eV barrier energy. FIG. 4 also illustrates barrier energy versus tunneling distance for an interface according to the present invention that has a barrier energy of $\Phi_{GI} \approx 1.08$ eV, which is selected as an illustrative example, and not by way of limitation. The smaller barrier energy $\Phi_{GI}$ reduces the energy to which the electrons must be excited to be stored on or removed from the floating gate 215, such as by thermal emission over the barrier. The smaller barrier energy $\Phi_{GI}$ also reduces the distance that electrons have to traverse, such as by Fowler-Nordheim tunneling, to be stored upon or removed from floating gate 215. In FIG. 4, "do" represents the tunneling distance of a conventional floating gate transistor due to the 3.3 eV barrier energy represented by the dashed line "OLD". The tunneling distance "dn" corresponds to a floating gate transistor according to the present invention and its smaller barrier energy, such as $\Phi_{GI} \approx 1.08$ eV, for example, represented by the dashed line "NEW". Even a small reduction in the tunneling distance results in a large increase in the tunneling probability, as described below, because the tunneling probability is an exponential function of the reciprocal of the tunneling distance.

The Fowler-Nordheim tunneling current density in gate insulator 225, which is illustrated approximately by Equation 3 below, is described in a textbook by S. M. Sze, "Physics of Semiconductor Devices," John Wiley & Sons, New York (1969), p. 496.

$$J = AE^2 e^{\left(-\frac{B}{E}\right)} \quad (3)$$

In Equation 3, J is the current density in units of amperes/cm$^2$, E is the electric field in gate insulator 225 in units of volts/cm and A and B are constants, which are particular to the material of gate insulator 225, that depend on the effective electron mass in the gate insulator 225 material and on the barrier energy $\Phi_{GI}$. The constants A and B scale with the barrier energy $\Phi_{GI}$, as illustrated approximately by Equations 4 and 5, which are disclosed in S. R. Pollack et al., "Electron Transport Through Insulating Thin Films," Applied Solid State Science, Vol. 1, Academic Press, New York, (1969), p. 354.

$$A \alpha \left(\frac{1}{\Phi_{GI}}\right) \quad (4)$$

$$B \alpha (\Phi_{GI})^{\frac{3}{2}} \quad (5)$$

For a conventional floating gate FET having a 3.3 eV barrier energy at the interface between the polysilicon floating gate and the SiO$_2$ gate insulator, A=5.5×10$^{-16}$ amperes/Volt$^2$ and B=7.07×10$^7$ Volts/cm, as disclosed in D. A. Baglee, "Characteristics and Reliability of 100 Å Oxides," Proc. 22nd Reliability Symposium, (1984), p. 152. One aspect of the present invention includes selecting a smaller barrier energy $\Phi_{GI}$ such as, by way of example, but not by way of limitation $\Phi_{GI} \approx 1.08$ eV. The constants A and B for $\Phi_{GI} \approx 1.08$ eV can be extrapolated from the constants A and B for the 3.3 eV polysilicon-SiO$_2$ barrier energy using Equations 4 and 5. The barrier energy $\Phi_{GI} \approx 1.08$ eV yields the resulting constants A=1.76×10$^{-15}$ amperes/Volt$^2$ and B=1.24×10$^7$ Volts/cm.

Figure 5:
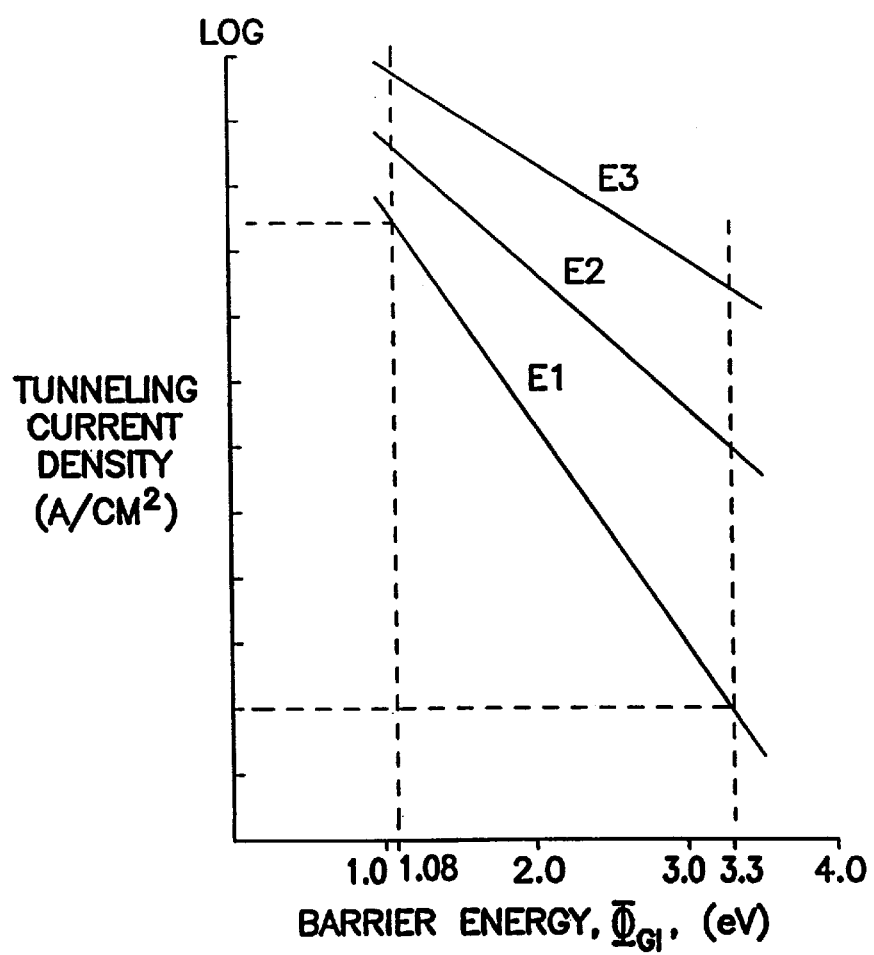
FIG. 5 is a graph that illustrates generally the relationship between Fowler-Nordheim tunneling current density vs. the barrier energy $\Phi_{GI}$ at various parameterized values $E_1<E_2<E_3$ of an electric field.

FIG. 5 is a graph that illustrates generally the relationship between Fowler-Nordheim tunneling current density vs. the barrier energy $\Phi_{GI}$, such as at various parameterized values $E_1 < E_2 < E_3$ of an electric field in gate insulator 225. The tunneling current density increases as electric field is increased. The tunneling current also increases by orders of magnitude as the barrier energy $\Phi_{GI}$ is decreased, such as by selecting the materials for floating gate 215 and gate insulator 225 or otherwise reducing the barrier energy $\Phi_{GI}$ according to the techniques of the present invention. In particular, FIG. 5 illustrates a comparison between tunneling current densities at the 3.3 eV barrier energy of a conventional polysilicon-SiO$_2$ interface and at the illustrative example barrier energy $\Phi_{GI} \approx 1.08$ eV for which constants A and B were extrapolated above. Reducing the 3.3 eV barrier energy to $\Phi_{GI} \approx 1.08$ eV increases the tunneling current density by several orders of magnitude.

Figure 6:
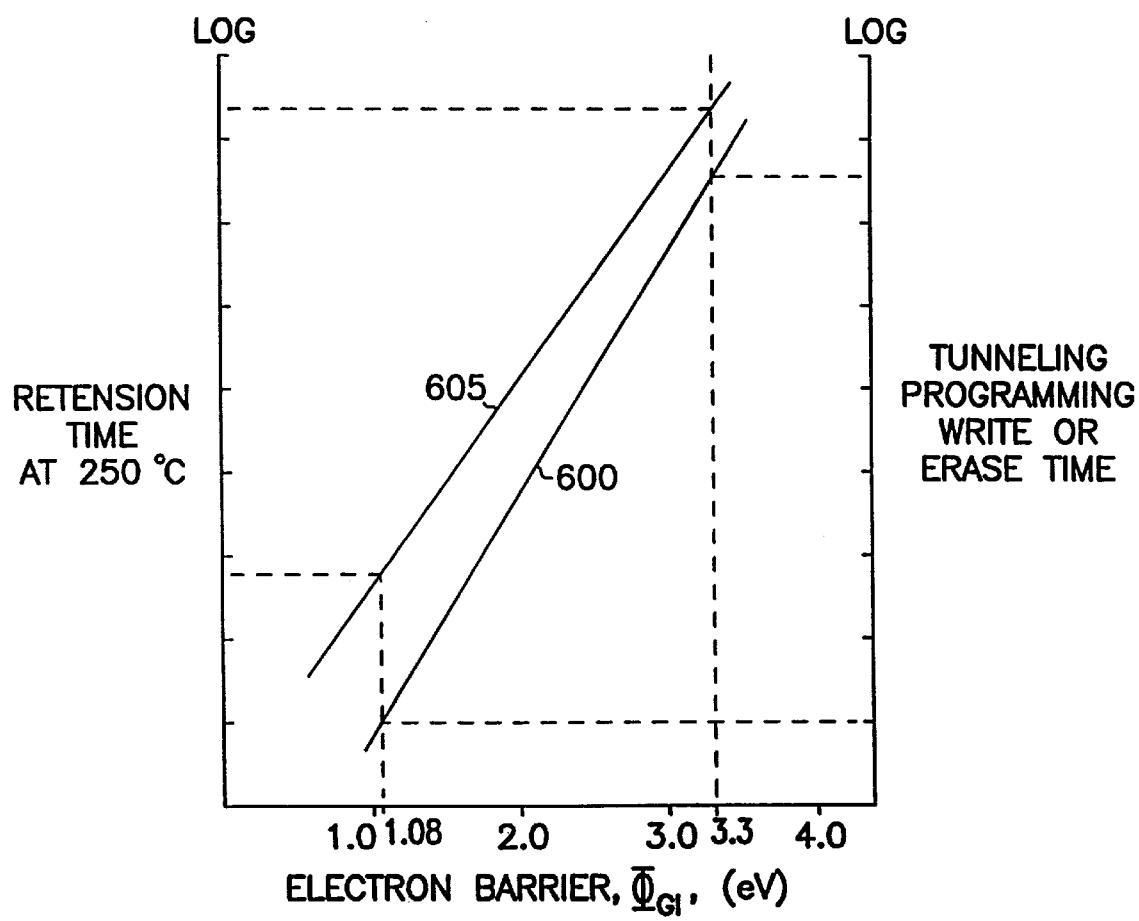
FIG. 6 illustrates generally how the barrier energy affects the time needed to perform write and erase operations by Fowler-Nordheim tunneling for a particular voltage.

FIG. 6 is a conceptual diagram, using rough order of magnitude estimates, that illustrates generally how the barrier energy affects the time needed to perform write and erase operations by Fowler-Nordheim tunneling for a particular voltage, such as across gate insulator 225. FIG. 6 also illustrates how the barrier energy affects data charge retention time, such as on floating gate 215 at a temperature of 250 degrees Celsius. Both write and erase time 600 and data charge retention time 605 are decreased by orders of magnitude as the barrier energy is decreased, according to the present invention, from the conventional polysilicon-SiO$_2$ interface barrier energy of 3.3 eV to the illustrative example lower barrier energy $\Phi_{GI} \approx 1.08$ eV for which constants A and B were extrapolated above.

The lower barrier energy $\Phi_{GI}$ and increased tunneling current advantageously provides faster write and erase times. This is particularly advantageous for "flash" EEPROMs or DEAPROMs in which many floating gate transistor memory cells must be erased simultaneously, requiring a longer time to transport the larger quantity of charge. For a flash EEPROM using a polysilicon floating gate transistor having an underlying SiO$_2$ gate insulator 225, the simultaneous erasure of a block of memory cells requires a time that is on the order of milliseconds. The write and erase time of the floating gate FET 200 is illustrated approximately by Equation 6.

$$t = \int_0^T dt = \int_0^Q \left(\frac{1}{J_{225} - J_{235}}\right) dQ \quad (6)$$

In Equation 6, t is the write/erase time, $J_{225}$ and $J_{235}$ are the respective tunneling current densities in gate dielectric 225 and intergate dielectric 235, Q is the charge density in Coulombs/cm$^2$ on floating gate 215. Equation 6 is evaluated for a specific voltage on control gate 220 using Equations 7 and 8.

$$E_{225} = \frac{V_{220}}{\left[d_{225} + d_{235}\left(\frac{\epsilon_{225}}{\epsilon_{235}}\right)\right] - \frac{Q}{\left[\epsilon_{225} + \epsilon_{235}\left(\frac{d_{225}}{d_{235}}\right)\right]}} \quad (7)$$

$$E_{235} = \frac{V_{220}}{\left[d_{235} + d_{225}\left(\frac{\epsilon_{235}}{\epsilon_{225}}\right)\right] + \frac{Q}{\left[\epsilon_{235} + \epsilon_{225}\left(\frac{d_{235}}{d_{225}}\right)\right]}} \quad (8)$$

In Equations 7 and 8, $V_{220}$ is the voltage on control gate 220, $E_{225}$ and $E_{235}$ are the respective electric fields in gate insulator 225 and intergate insulator 235, $d_{225}$ and $d_{235}$ are the respective thicknesses of gate insulator 225 and intergate insulator 235, and $\epsilon_{225}$ and $\epsilon_{235}$ are the respective permittivities of gate insulator 225 and intergate insulator 235.

Figure 7:
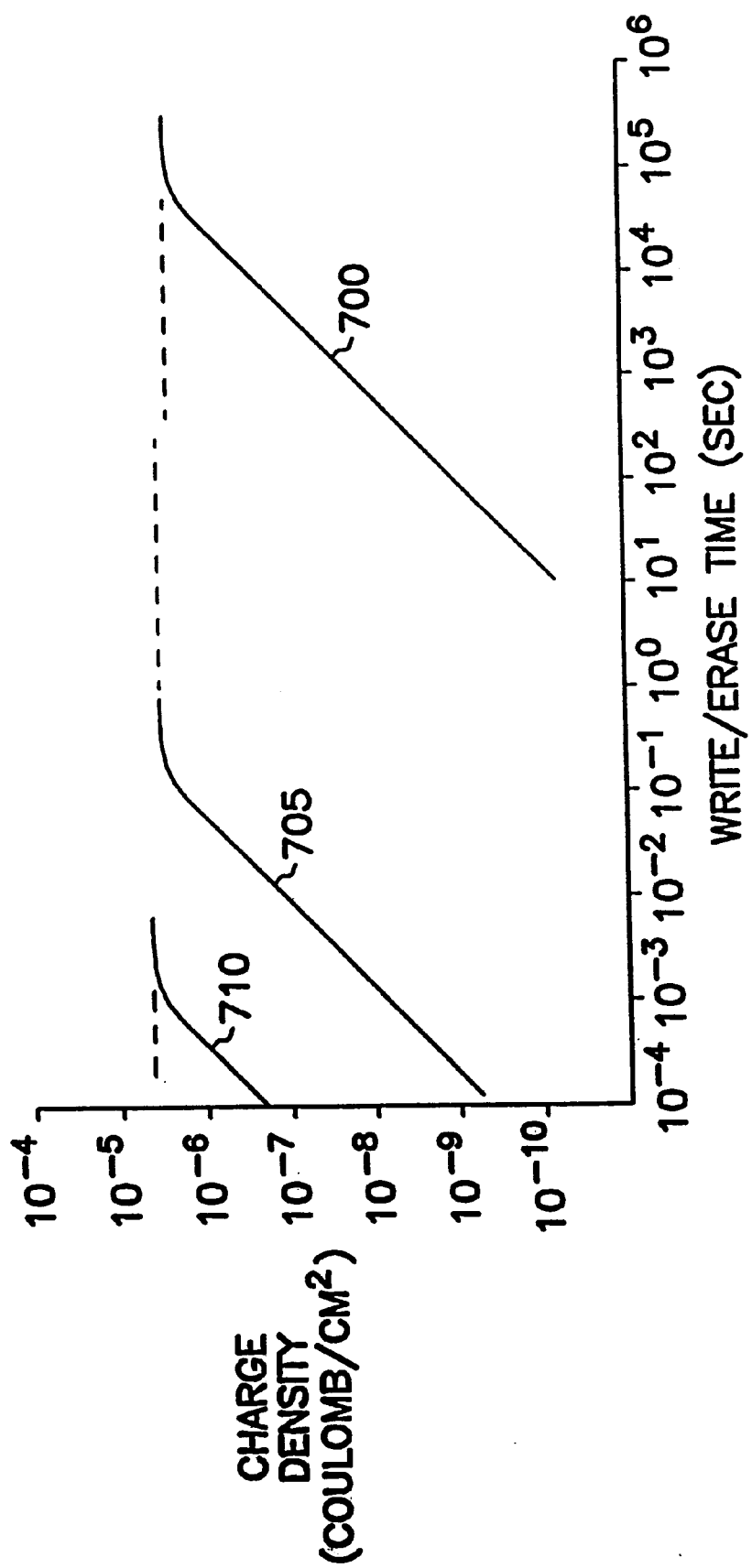
FIG. 7 is a graph that illustrates generally charge density vs. write/erase time for thee different embodiments of a floating gate FET.

FIG. 7 is a graph that illustrates generally charge density vs. write/erase time for three different embodiments of the floating gate FET 200, each of which have a polysilicon floating gate 215, by way of illustrative example. Line 700 illustrates generally, by way of example, but not by way of limitation, the charge density vs. write/erase time obtained for a floating gate FET 200 having a 100 Å $SiO_2$ gate insulator 225 and a 150 Å $SiO_2$ (or thinner oxynitride equivalent capacitance) intergate insulator 235.

Line 705 is similar to line 700 in all respects except that line 705 illustrates a floating gate FET 200 in which gate insulator 225 comprises a material having a higher electron affinity $\chi_{225}$ than $SiO_2$, thereby providing a lower barrier energy $\Phi_{GI}$ at the interface between polysilicon floating gate 215 and gate insulator 225. The increased tunneling current results in shorter write/erase times than those illustrated by line 700.

Figure 8:
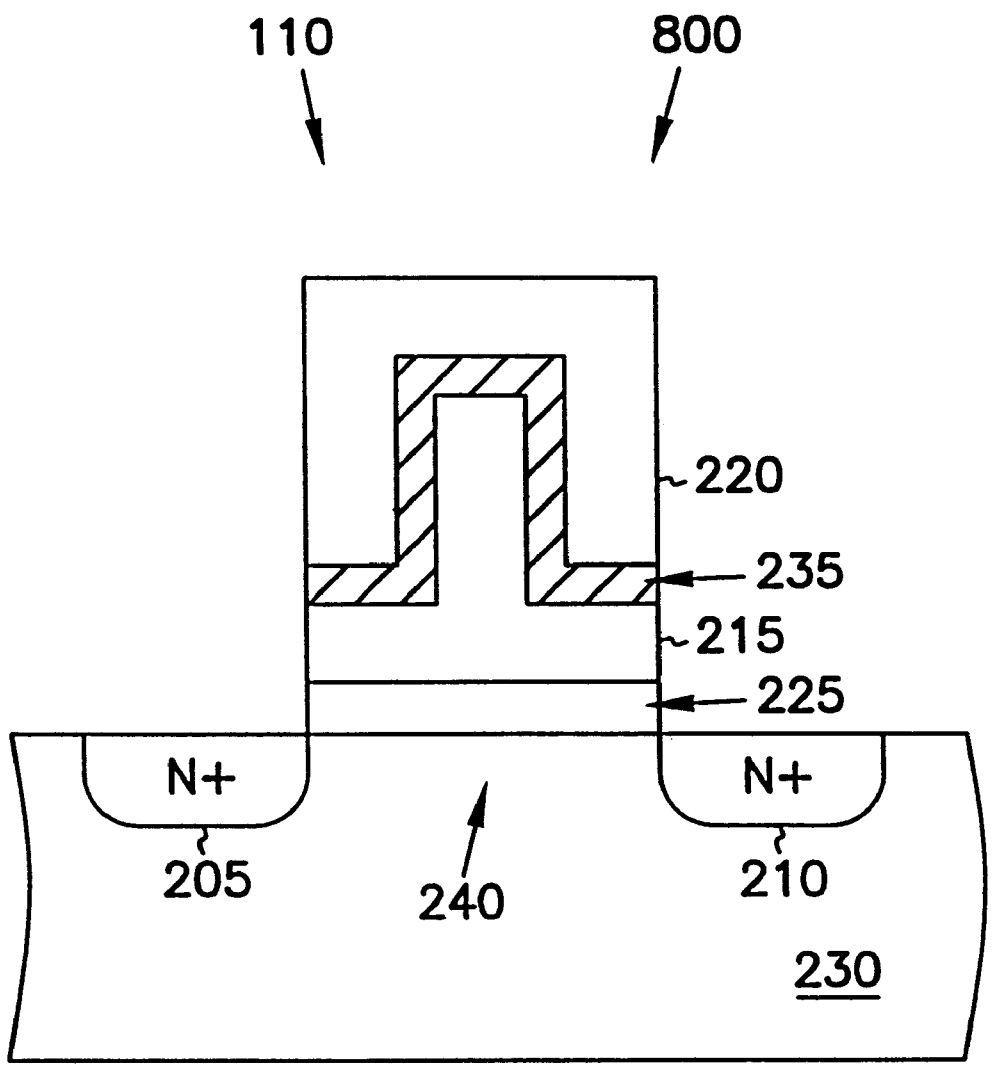
FIG. 8 is a cross-sectional view, similar to FIG. 2, but having a larger area control gate—floating gate capacitor than the floating gate—substrate capacitor.

Line 710 is similar to line 705 in all respects except that line 710 illustrates a floating gate FET 200 in which gate insulator 225 has a lower barrier energy $\Phi_{GI}$ than for line 705, or intergate insulator 235 has a higher permittivity $\epsilon_{235}$ than for line 705, or control gate 220 has a larger area than floating gate 215, such as illustrated by way of example by the floating gate FET 800 in the cross-sectional view of FIG. 8. As seen in FIG. 8, the area of a capacitor formed by the control gate 220, the floating gate 215, and the intergate insulator 235 is larger than the area of a capacitor formed by the floating gate 215, the gate insulator 225, and the inversion channel 240 underlying gate insulator 225. Alternatively, or in combination with the techniques illustrated in FIG. 8, the intergate insulator 235 can have a higher permittivity than the permittivity of silicon dioxide.

As illustrated in FIG. 7, the barrier energy $\Phi_{GI}$ can be selected to reduce the write/erase time. In one embodiment, by way of example, but not by way of limitation, the barrier energy $\Phi_{GI}$ is selected to obtain a write/erase time of less than or equal to 1 second, as illustrated in FIG. 7. In another embodiment, by way of example, but not by way of limitation, the barrier energy $\Phi_{GI}$ is selected to obtain a write/erase time of less than or equal to 1 millisecond, as illustrated in FIG. 7. Other values of write/erase time can also be obtained by selecting the appropriate value of the barrier energy $\Phi_{GI}$.

The lower barrier energy $\Phi_{GI}$ and increased tunneling current also advantageously reduces the voltage required for writing and erasing the memory cells 110. For example, conventional polysilicon floating gate transistors typically require complicated and noisy on-chip charge pump circuits to generate the large erasure voltage, which typically far exceeds other voltages required on the integrated circuit The present invention allows the use of lower erasure voltages that are more easily provided by simpler on-chip circuits. Reducing the erasure voltage also lowers the electric fields, minimizing reliability problems that can lead to device failure, and better accommodating downward scaling of device dimensions. In one embodiment, the barrier energy $\Phi_{GI}$ is selected, as described above, to obtain an erase voltage of less than the 12 Volts required by typical EEPROM memory cells.

Alternatively, the thickness of the gate insulator 225 can be increased from the typical thickness of a silicon dioxide gate insulator to improve reliability or simplify processing, since the lower barrier energy $\Phi_{GI}$ allows easier transport of charge across the gate insulator 225 by Fowler-Nordheim tunneling.

The lower barrier energy $\Phi_{GI}$ also decreases the data charge retention time of the charge stored on the floating gate 215, such as from increased thermal excitation of stored charge over the lower barrier $\Phi_{GI}$. However, conventional polysilicon floating gates and adjacent $SiO_2$ insulators (e.g., 90 Å thick) have a data charge retention time estimated in the millions of years at a temperature of 85 degrees C., and estimated in the 1000 hour range even at extremely high temperatures such as 250 degrees C. Since such long data charge retention times are longer than what is realistically needed, a shorter data charge retention time can be accommodated in order to obtain the benefits of the smaller barrier energy $\Phi_{GI}$. In one embodiment of the present invention, by way of example, but not by way of limitation, the barrier energy $\Phi_{GI}$ is lowered to $\Phi_{GI} \approx 1.08$ eV by appropriately selecting the composition of the materials of floating gate 215 and gate insulator 225, as described below. As a result, an estimated data charge retention time of approximately 40 seconds at a high temperature, such as 250 degrees C., is obtained.

According to one aspect of the present invention, the data stored on the memory cell 110 is periodically refreshed at an interval that is shorter than the data charge retention time. In one embodiment, for example, the data is refreshed every few seconds, such as for an embodiment having a high temperature retention time of approximately 40 seconds for $\Phi_{GI} \approx 1.08$ eV. The exact refresh rate can be experimentally determined and tailored to a particular process of fabricating the DEAPROM. By decreasing the data charge retention time and periodically refreshing the data, the write and erase operations can be several orders of magnitude faster, as described above with respect to FIG. 7.

Figure 9A:
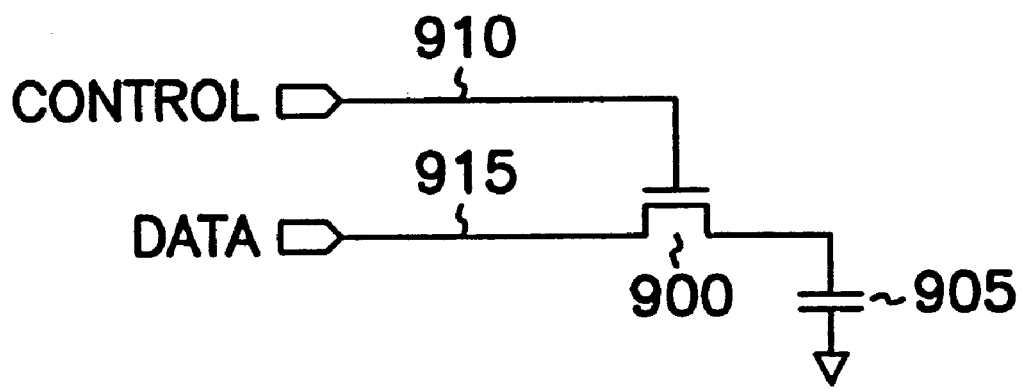
FIG. 9A is a schematic diagram, labeled prior art, that illustrates generally a conventional DRAM memory cell.
Figure 9B:
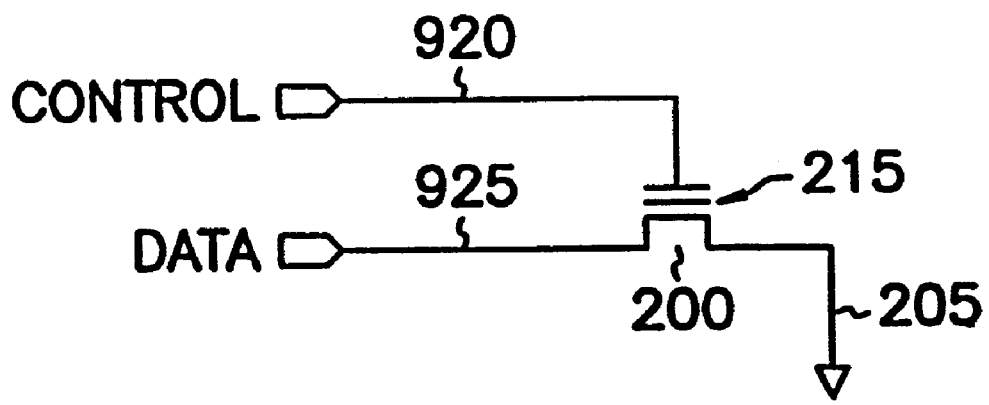
FIG. 9B is a schematic diagram that illustrates generally one embodiment of a floating gate FET memory cell according to the present invention.

FIGS. 9A and 9B are schematic diagrams that respectively illustrate generally a conventional DRAM memory cell and the present invention's floating gate FET 200 embodiment of memory cell 110. In FIG. 9A, the DRAM memory cell includes an access FET 900 and stacked or trench storage capacitor 905. Data is stored as charge on storage capacitor 905 by providing a control voltage on control line 910 to activate FET 900 for conducting charge. Data line 915 provides a write voltage to conduct charge across FET 900 for storage on storage capacitor 905. Data is read by providing a control voltage on control line 910 to activate FET 900 for conducting charge from storage capacitor 905, thereby incrementally changing a preinitialized voltage on data line 915. The resulting small change in voltage on data line 915 must be amplified by a sense amplifier for detection. Thus, the DRAM memory cell of FIG. 9A inherently provides only a small data signal. The small data signal is difficult to detect.

In FIG. 9B, the memory cell 110 according to the present invention is a DEAPROM memory cell that includes floating gate FET 200, having source 205 coupled to a ground voltage or other reference potential. Data is stored as charge on floating gate 215 by providing a control voltage on control line 920 and a write voltage on data line 925 for hot electron injection or Fowler-Nordheim tunneling. This is similar to conventional EEPROM techniques, but advantageously uses the reduced voltages and/or a shorter write time of the present invention.

The DEAPROM memory cell can be smaller than the DRAM memory cell of FIG. 9A, allowing higher density data storage. The leakage of charge from floating gate 215 can be made less than the reverse-bias junction leakage from storage capacitor 905 of the DRAM memory cell by tailoring the barrier energy $\Phi_{GI}$ according to the techniques of the present invention. Also, the DEAPROM memory cell advantageously uses the large transconductance gain of the floating gate FET 200. The conventional DRAM memory cell of FIG. 9A provides no such gain; it is read by directly transferring the data charge from storage capacitor 905. By contrast, the DEAPROM memory cell is read by placing a read voltage on control line 920, and detecting the current conducted through FET 200, such as at data line 925. The current conducted through FET 200 changes significantly in the presence or absence of charge stored on floating gate 215. Thus, the present invention advantageously provides an large data signal that is easy to detect, unlike the small data signal provided by the conventional DRAM memory cell of FIG. 9A.

For example, the current for floating gate FET 200 operating in the saturation region can be approximated by Equation 9.

$$I_{DS} = \frac{1}{2}\mu C_o\left(\frac{W}{L}\right)(V_G - V_T)^2 \quad (9)$$

In Equation 9, $I_{DS}$ is the current between drain 210 and source 205, $C_o$ is the capacitance per unit area of the gate insulator 225, W/L is the width/length aspect ratio of FET 200, $V_G$ is the gate voltage applied to control gate 220, and $V_T$ is the turn-on threshold voltage of FET 200.

For an illustrative example, but not by way of limitation, a minimum-sized FET having W/L=1, can yield a transconductance gain of approximately 71 µA/Volt for a typical process. In this illustrative example, sufficient charge is stored on floating gate 215 to change the effective threshold voltage $V_T$ by approximately 1.4 Volts, thereby changing the current $I_{DS}$ by approximately 100 microamperes. This significant change in current can easily be detected, such as by sampling or integrating over a time period of approximately 10 nanoseconds, for example, to obtain a detected data charge signal of 1000 fC. Thus, the DEAPROM memory cell is capable of yielding a detected data charge signal that is approximately an order of magnitude larger than the typical 30 fC to 100 fC data charges typically stored on DRAM stacked or trench capacitors. Since DEAPROM memory cell requires a smaller capacitance value than a conventional DRAM memory cell, DEAPROM memory cell can be made smaller than a conventional DRAM memory cell. Moreover, because the CMOS-compatible DEAPROM storage capacitor is integrally formed as part of the transistor, rather than requiring complex and costly non-CMOS stacked and trench capacitor process steps, the DEAPROM memory of the present invention should be cheaper to fabricate than DRAM memory cells, and should more easily scale downward as CMOS technology advances.

Gin and GaAlN Gate Material Embodiments

In one embodiment, the present invention provides a DEAPROM having a memory cell 110 including a FET 200 having an at least partially crystalline (e.g., monocrystalline, polycrystalline, microcrystalline, nanocrystalline, or combination thereof) gallium nitride (GaN) or gallium aluminide nitride (GaAlN) floating gate 215.

In one embodiment, a composition v of a polycrystalline $Ga_{1-v}Al_vN$ floating gate 215 is selected approximately between 0<v<1 to obtain a desired barrier energy, as described below. The GaAlN floating gate 215 provides a lower electron affinity than polysilicon. The GaAlN floating gate 215 electron affinity can be approximately between 0.6 eV<$\chi_{215}$<2.7 eV as the GaAlN composition variable v is decreased from 1 to 0. See V. M. Bermudez et al. "The Growth and Properties of Al and AlN films on GaN" *J. Appl. Physics. Vol.* 79, No. 1, pp. 110–119 (1996). As a result, the GaAlN floating gate 215 provides a smaller resulting barrier energy $\Phi_{GI}$ than a polysilicon gate material having an electron affinity $\chi_{215}\approx4.2$ eV. For example, using a $SiO_2$ gate insulator 225, a barrier energy approximately between −0.3 eV<$\Phi_{GI}$<1.8 eV is obtained using an GaAlN floating gate 215 as the GaAlN composition v varies between v≈1 (i.e., approximately AlN) and v≈0 (i.e., approximately GaN). By contrast, a conventional polysilicon floating gate material provides a barrier energy $\Phi_{GI}\approx3.3$ eV at an interface with an $SiO_2$ gate insulator 225.

In one embodiment, substrate 230 is bulk silicon, although other bulk semiconductor and semiconductor-on-insulator (SOI) materials could also be used for substrate 230 such as, for example, sapphire, gallium arsenide (GaAs), GaN, AlN, and diamond. In one embodiment, gate insulator 225 is $SiO_2$, although other dielectric materials could also be used for gate insulator 225, as described above, such as amorphous insulating GaN (a-GaN), and amorphous insulating AlN (a-AlN). The FET 200 using a GaAlN floating gate 215 has mobility and turn-on threshold voltage ($V_T$) magnitude parameters that are advantageously influenced less by charge at $SiO_2$-GaAlN interface surface states than at a conventional $SiO_2$-polysilicon interface.

In one embodiment floating gate 215 is formed of a polycrystalline, microcrystalline, or nanocrystalline, GaN thin film that is CVD deposited on a thin (e.g., 500 Å thick) AlN buffer layer, such as by metal organic chemical vapor deposition (MOCVD), which advantageously yields improved crystal quality and reduced microscopic fluctuation of crystallite orientation. See e.g., V. M. Bermudez et al. "The Growth and Properties of Al and AlN films on GaN" *J. Appl. Physics*, Vol. 79, No. 1, pp. 110–119 (1996). See also I. Akasaki et al. "Effects of AlN Buffer Layer on Crystallographic Structure and On Electrical and Optical Properties of GaN and $Ga_{1-x}Al_xN$ Films Grown on Sapphire Substrate by MOVPE," *J. Of Crystal Growth*, Vol. 98, pp. 209–19, North Holland, Amsterdam (1989).

In one embodiment, floating gate 215 is formed from a GaN film grown in a horizontal reactor operating at atmospheric pressure. Trimethyl gallium (TMG), timethylaluminum (TMA) and ammonia (NH$_3$) are used as source gases, and hydrogen (H$_2$) is used as a carrier gas. The TMG, TMA and NH$_3$ are mixed just before the reactor, and the mixture is fed at high velocity (e.g., 110 cm/s) to a slanted substrate 230 through a delivery tube. The desired GaAlN composition v is obtained by controlling the concentration ratio of TMG to TMA. In one embodiment, a 500 Å AlN buffer layer is obtained by growth at 600 degrees Celsius at a deposition rate of 100 Å/minute for approximately 5 minutes, then a epitaxial crystalline or polycrystalline layer of GaN is deposited at 1000 degrees Celsius.

In another embodiment plasma enhanced molecular beam epitaxy (PEMBE) is used to form a GaN or GaAlN floating gate 215, for example, by using electron cyclotron resonance (ECR) plasma during molecular beam epitaxy (MBE). The background pressure in the MBE chamber is typically less than $10^{-10}$ torr. Ga flux (e.g., 99.99999% pure) is supplied by a conventional Knudsen effusion cell. The semiconductor substrates 230 are heated to a temperature of approximately 850 degrees Celsius, and exposed to a nitrogen plasma (e.g., 35 Watt plasma power level) to clean the surface of the substrate 230 and form a thin AlN layer thereupon. The temperature is then lowered to approximately 550 degrees Celsius for growth of a thin (e.g., 300 Å) GaN buffer layer (e.g., using 20 Watt plasma power level for growth in a low active nitrogen overpressure environment). The temperature is then increased, such as to approximately 800 degrees Celsius, to form the remainder of the GaN or GaAlN film forming floating gate 215, such as at a deposition rate of approximately 0.22 microns/hour.

Conclusion

The present invention provides a DEAPROM cell. The memory cell has a gallium nitride (GaN) or gallium aluminum nitride (GaAlN) floating electrode, such as a floating gate electrode in a floating gate field-effect transistor. According to one aspect of the invention, a barrier energy between the floating electrode and the insulator is lower than the barrier energy between polysilicon and $SiO_2$, which is approximately 3.3 eV. The memory cell also provides large transconductance gain, which provides a more easily detected signal and reduces the required data storage capacitance value. According to another aspect of the invention, the shorter retention time of data charges on the floating electrode, resulting from the smaller barrier energy, is accommodated by refreshing the data charges on the floating electrode. By decreasing the data charge retention time and periodically refreshing the data, the write and erase operations can be several orders of magnitude faster. In this respect, the memory operates similar to a memory cell in DRAM, but avoids the process complexity, additional space needed, and other limitations of forming stacked or trench DRAM capacitors.

Although specific embodiments have been illustrated and described herein, those of ordinary skill in the art will appreciate that the abovedescribed embodiments can be used in combination, and any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A system comprising:
   a processor;
   a memory device coupled to the processor, the memory device comprising a plurality of memory cells, wherein each memory cell includes a transistor comprising:
      a source region in a substrate;
      a drain region in the substrate;
      a channel region in the substrate between the source and drain regions;
      a floating gate separated from the channel region by a silicon dioxide insulator, wherein the floating gate includes a floating gate material selected from the group consisting of gallium nitride (GaN) and gallium aluminum nitride (GaAlN); and
      a control gate separated from the floating gate by an intergate dielectric.

2. The system of claim 1 wherein:
   a material composition of the floating gate has an electron affinity causing a barrier energy between the floating gate and the silicon dioxide insulator to be less than approximately 3.3 eV;
   the material composition of the floating gate has a smaller electron affinity than polycrystalline silicon;
   an area of a capacitor formed by the control gate, the floating gate, and the intergate dielectric is larger than an area of a capacitor formed by the floating gate, the silicon dioxide insulator, and the channel region;
   the intergate dielectric has a permittivity that is higher than a permittivity of silicon dioxide;
   the memory device further comprises:
      a refresh circuit to dynamically refresh data stored on the floating gates of the transistors at a refresh rate, the refresh rate being based on the barrier energy;
      a row decoder circuit;
      a column decoder circuit;
      a voltage control circuit; and
      command and control circuitry; and
   the system further comprises control lines, address lines, and data lines coupled between the processor and the memory device.

3. A system comprising:
   a processor;
   a memory device coupled to the processor, the memory device comprising a plurality of memory cells, wherein each memory cell includes a transistor comprising:
      a source region in a substrate;
      a drain region in the substrate;
      a channel region in the substrate between the source and drain regions;
      a floating gate separated from the channel region by a silicon dioxide insulator, wherein the floating gate includes a floating gate material selected from the group consisting of gallium nitride (GaN) and gallium aluminum nitride (GaAlN); and
      a control gate separated from the floating gate by an intergate dielectric; and
      wherein the memory device further comprises a refresh circuit to dynamically refresh, at a refresh rate, data stored on the floating gates of the transistors.

4. The memory device of claim 3, wherein the refresh rate is based on a barrier energy between the floating gate and the insulator.

5. The system of claim 3 wherein the memory device further comprises:
   a column decoder circuit;
   a row decoder circuit;
   a voltage control circuit; and
   command and control circuitry.

6. The system of claim 3, further comprising control lines, address lines, and data lines coupled between the memory device and the processor.

7. The system of claim 3, further comprising a row decoder circuit to provide a write voltage to the drain region of one of the transistors when data is written to the transistor and a column decoder circuit to provide a control voltage to the control gate of the transistor when data is written to the transistor.

8. The system of claim 3, wherein a material composition of the floating gate is selected to obtain a smaller electron affinity than polycrystalline silicon.

9. The system of claim 3, wherein the floating gate is transconductively capacitively coupled to the channel region.

10. The system of claim 3 wherein:
an area of a capacitor formed by the control gate, the floating gate, and the intergate dielectric is larger than an area of a capacitor formed by the floating gate, the silicon dioxide insulator, and the channel region;
the intergate dielectric has a permittivity that is higher than a permittivity of silicon dioxide; and
the memory device further comprises a refresh circuit to dynamically refresh data stored on the floating gates of the transistors at a refresh rate.

11. The system of claim 3, wherein materials comprising the floating gate are selected to have an electron affinity causing a barrier energy between the floating gate and the silicon dioxide insulator to be less than approximately 3.3 eV.

12. The system of claim 11, wherein the barrier energy is selected to obtain a desired data charge retention time of less than or equal to approximately 40 seconds at 250 degrees Celsius.

13. The system of claim 11, wherein the barrier energy is selected to obtain a desired erase time of less than approximately 1 second.

14. The system of claim 11, wherein the barrier energy is selected to obtain a desired erase voltage of less than approximately 12 Volts.

15. The system of claim 3, wherein the barrier energy is less than approximately 2.0 eV.

16. A system comprising:
a processor;
a memory device coupled to the processor, the memory device comprising a plurality of memory cells, wherein each memory cell includes a transistor comprising:
a source region in a substrate;
a drain region in the substrate;
a channel region in the substrate between the source and drain regions;
a floating gate separated from the channel region by a silicon dioxide insulator, wherein the floating gate includes a floating gate material selected from the group consisting of gallium nitride (GaN) and gallium aluminum nitride (GaAlN);
a control gate separated from the floating gate by an intergate dielectric; and
wherein an area of a capacitor formed by the control gate, the floating gate, and the intergate dielectric is larger than an area of a capacitor formed by the floating gate, the silicon dioxide insulator, and the channel region.

17. The system of claim 16 wherein:
a material composition of the floating gate has an electron affinity causing a barrier energy between the floating gate and the silicon dioxide insulator to be less than approximately 3.3 eV;
the material composition of the floating gate has a smaller electron affinity than polycrystalline silicon;
the intergate dielectric has a permittivity that is higher than a permittivity of silicon dioxide;
the memory device further comprises:
a refresh circuit to dynamically refresh data stored on the floating gates of the transistors at a refresh rate, the refresh rate being based on the barrier energy;
a row decoder circuit;
a column decoder circuit;
a voltage control circuit; and
command and control circuitry; and
the system further comprises control lines, address lines, and data lines coupled between the processor and the memory device.

18. A memory device comprising:
a plurality of memory cells, wherein each memory cell includes a transistor comprising:
a source region in a substrate;
a drain region in the substrate;
a channel region in the substrate between the source and drain regions;
a floating gate separated from the channel region by an insulator, wherein the floating gate includes a floating gate material selected from the group consisting of gallium nitride (GaN) and gallium aluminum nitride (GaAlN), and materials comprising at least one of the floating gate and the insulator are selected to have an electron affinity causing a barrier energy between the floating gate and the insulator to be selected at less than approximately 3.3 eV, and the barrier energy is selected to obtain a desired data charge retention time of less than or equal to approximately 40 seconds at 250 degrees Celsius, and the barrier energy is selected to obtain a desired erase time of less than approximately 1 second, and the barrier energy is selected to obtain a desired erase voltage of less than approximately 12 Volts, and the insulator comprises a material that has a larger electron affinity than silicon dioxide, and a material composition of the floating gate is selected to obtain a smaller electron affinity than polycrystalline silicon; and
a control gate separated from the floating gate by an intergate dielectric; and
a refresh circuit to dynamically refresh, at a refresh rate, data stored on the floating gates of the transistors;
a row decoder circuit; and
a column decoder circuit.

19. The memory device of claim 18 wherein:
an area of a capacitor formed by the control gate, the floating gate, and the intergate dielectric is larger than an area of a capacitor formed by the floating gate, the insulator, and the channel region;
the intergate dielectric has a permittivity that is higher than a permittivity of silicon dioxide; and
the memory device further comprises:
a voltage control circuit; and
command and control circuitry.

20. A system comprising:
a processor; and
a memory device coupled to the processor, the memory device comprising a plurality of memory cells, each memory cell comprising:
a floating gate comprising gallium nitride (GaN) or gallium aluminum nitride (GaAlN); and
a silicon dioxide insulator between the floating gate and a substrate.

21. The system of claim 20 wherein:
each memory cell further comprises:
a source region in the substrate;
a drain region in the substrate;
a channel region in the substrate between the source region and the drain region, the silicon dioxide insulator separating the channel region from the floating gate; and
a control gate separated from the floating gate by an intergate dielectric;
a material composition of the floating gate has an electron affinity causing a barrier energy between the floating gate and the silicon dioxide insulator to be less than approximately 3.3 eV;

the material composition of the floating gate has a smaller electron affinity than polycrystalline silicon;

an area of a capacitor formed by the control gate, the floating gate, and the intergate dielectric is larger than an area of a capacitor formed by the floating gate, the silicon dioxide insulator, and the channel region;

the intergate dielectric has a permittivity that is higher than a permittivity of silicon dioxide;

the memory device further comprises:
 a refresh circuit to dynamically refresh data stored on the floating gates of the memory cells at a refresh rate, the refresh rate being based on the barrier energy;
 a row decoder circuit;
 a column decoder circuit;
 a voltage control circuit; and
 command and control circuitry; and the system further comprises control lines, address lines, and data lines coupled between the processor and the memory device.

22. A memory cell comprising:

a substrate;

a storage electrode to store charge, the storage electrode comprising gallium aluminum nitride (GaAlN); and an insulator separating the storage electrode from the substrate.

23. The memory cell of claim 22, further comprising:

a source region in the substrate;

a drain region in the substrate;

a channel region in the substrate between the source region and the drain region, the insulator separating the channel region from the storage electrode;

a control gate separated from the storage electrode by a dielectric; and wherein:
 the insulator comprises a silicon dioxide insulator;
 a material composition of the storage electrode has an electron affinity causing a barrier energy between the storage electrode and the silicon dioxide insulator to be less than approximately 3.3 eV;
 the material composition of the storage electrode has a smaller electron affinity than polycrystalline silicon;
 an area of a capacitor formed by the control gate, the storage electrode, and the dielectric is larger than an area of a capacitor formed by the storage electrode, the silicon dioxide insulator, and the channel region; and
 the dielectric has a permittivity that is higher than a permittivity of silicon dioxide.

24. The memory cell of claim 22 wherein:

the insulator comprises a silicon dioxide insulator;

a material composition of the storage electrode has an electron affinity causing a barrier energy between the storage electrode and the silicon dioxide insulator to be less than approximately 3.3 eV;

the material composition of the storage electrode has a smaller electron affinity than polycrystalline silicon;

an area of a capacitor formed by the control gate, the storage electrode, and the dielectric is larger than an area of a capacitor formed by the storage electrode, the silicon dioxide insulator, and the channel region; and the dielectric has a permittivity that is higher than a permittivity of silicon dioxide.

25. A memory cell comprising:

a source region in a substrate;

a drain region in the substrate;

a channel region in the substrate between the source region and the drain region;

a storage electrode to store charge, the storage electrode comprising gallium aluminum nitride (GaAlN) and being separated from the channel region by an insulator; and a control gate separated from the storage electrode by a dielectric.

26. A transistor comprising:

a substrate;

a floating gate to store charge, the floating gate comprising gallium aluminum nitride (GaAlN); and an insulator separating the floating gate from the substrate.

27. The transistor of claim 26, further comprising:

a source region in the substrate;

a drain region in the substrate;

a channel region in the substrate between the source region and the drain region, the insulator separating the channel region from the floating gate;

a control gate separated from the floating gate by a dielectric; and wherein:
 the insulator comprises a silicon dioxide insulator;
 a material composition of the floating gate has an electron affinity causing a barrier energy between the floating gate and the silicon dioxide insulator to be less than approximately 3.3 eV;
 the material composition of the floating gate has a smaller electron affinity than polycrystalline silicon;
 an area of a capacitor formed by the control gate, the floating gate, and the dielectric is larger than an area of a capacitor formed by the floating gate, the silicon dioxide insulator, and the channel region; and
 the dielectric has a permittivity that is higher than a permittivity of silicon dioxide.

28. A transistor comprising:

a source region in a substrate;

a drain region in the substrate;

a channel region in the substrate between the source region and the drain region;

a floating gate to store charge, the floating gate comprising gallium aluminum nitride (GaAlN) and being separated from the channel region by an insulator; and a control gate separated from the floating gate by a dielectric.

29. The transistor of claim 28 wherein:

the insulator comprises a silicon dioxide insulator;

a material composition of the floating gate has an electron affinity causing a barrier energy between the floating gate and the silicon dioxide insulator to be less than approximately 3.3 eV;

the material composition of the floating gate has a smaller electron affinity than polycrystalline silicon;

an area of a capacitor formed by the control gate, the floating gate, and the dielectric is larger than an area of a capacitor formed by the floating gate, the silicon dioxide insulator, and the channel region; and the dielectric has a permittivity that is higher than a permittivity of silicon dioxide.

30. A memory device comprising:
a plurality of memory cells, each memory cell comprising:
   a substrate;
   a storage electrode to store charge, the storage electrode comprising gallium aluminum nitride (GaAlN); and
   an insulator separating the storage electrode from the substrate.

31. The memory device of claim 30 wherein:
each memory cell further comprises:
   a source region in the substrate;
   a drain region in the substrate;
   a channel region in the substrate between the source region and the drain region, the insulator separating the channel region from the storage electrode; and
   a control gate separated from the storage electrode by a dielectric;
the insulator comprises a silicon dioxide insulator;
a material composition of the storage electrode has an electron affinity causing a barrier energy between the storage electrode and the silicon dioxide insulator to be less than approximately 3.3 eV;
the material composition of the storage electrode has a smaller electron affinity than polycrystalline silicon;
an area of a capacitor formed by the control gate, the storage electrode, and the dielectric is larger than an area of a capacitor formed by the storage electrode, the silicon dioxide insulator, and the channel region;
the dielectric has a permittivity that is higher than a permittivity of silicon dioxide; and
the memory device further comprises:
   a refresh circuit to dynamically refresh data stored on the storage electrodes at a refresh rate, the refresh rate being based on the barrier energy;
   a row decoder circuit;
   a column decoder circuit;
   a voltage control circuit; and
   command and control circuitry.

32. A memory device comprising:
a plurality of memory cells, each memory cell comprising:
   a source region in a substrate;
   a drain region in the substrate;
   a channel region in the substrate between the source region and the drain region;
   a floating gate to store charge, the floating gate comprising gallium aluminum nitride (GaAlN) and being separated from the channel region by an insulator; and
   a control gate separated from the floating gate by a dielectric.

33. The memory device of claim 32 wherein:
the insulator comprises a silicon dioxide insulator;
a material composition of the floating gate has an electron affinity causing a barrier energy between the floating gate and the silicon dioxide insulator to be less than approximately 3.3 eV;
the material composition of the floating gate has a smaller electron affinity than polycrystalline silicon;
an area of a capacitor formed by the control gate, the floating gate, and the dielectric is larger than an area of a capacitor formed by the floating gate, the silicon dioxide insulator, and the channel region;
the dielectric has a permittivity that is higher than a permittivity of silicon dioxide; and
the memory device further comprises:
   a refresh circuit to dynamically refresh data stored on the floating gates at a refresh rate, the refresh rate being based on the barrier energy;
   a row decoder circuit;
   a column decoder circuit;
   a voltage control circuit; and
   command and control circuitry.

34. A system comprising:
a processor; and
a memory device coupled to the processor, the memory device comprising a plurality of memory cells, each memory cell comprising:
   a substrate;
   a storage electrode to store charge, the storage electrode comprising gallium aluminum nitride (GaAlN); and
   an insulator separating the storage electrode from the substrate.

35. The system of claim 34 wherein:
each memory cell further comprises:
   a source region in the substrate;
   a drain region in the substrate;
   a channel region in the substrate between the source region and the drain region, the insulator separating the channel region from the storage electrode; and
   a control gate separated from the storage electrode by a dielectric;
the insulator comprises a silicon dioxide insulator;
a material composition of the storage electrode has an electron affinity causing a barrier energy between the storage electrode and the silicon dioxide insulator to be less than approximately 3.3 eV;
the material composition of the storage electrode has a smaller electron affinity than polycrystalline silicon;
an area of a capacitor formed by the control gate, the storage electrode, and the dielectric is larger than an area of a capacitor formed by the storage electrode, the silicon dioxide insulator, and the channel region;
the dielectric has a permittivity that is higher than a permittivity of silicon dioxide; and
the memory device further comprises:
   a refresh circuit to dynamically refresh data stored on the storage electrodes at a refresh rate, the refresh rate being based on the barrier energy;
   a row decoder circuit;
   a column decoder circuit;
   a voltage control circuit; and
   command and control circuitry; and
the system further comprises control lines, address lines, and data lines coupled between the processor and the memory device.

36. A system comprising:
a processor; and
a memory device coupled to the processor, the memory device comprising a plurality of memory cells, each memory cell comprising:
   a source region in a substrate;
   a drain region in the substrate;
   a channel region in the substrate between the source region and the drain region;
   a floating gate to store charge, the floating gate comprising gallium aluminum nitride (GaAlN) and being separated from the channel region by an insulator; and
   a control gate separated from the floating gate by a dielectric.

37. The system of claim 36 wherein:

the insulator comprises a silicon dioxide insulator;

a material composition of the floating gate has an electron affinity causing a barrier energy between the floating gate and the silicon dioxide insulator to be less than approximately 3.3 eV;

the material composition of the floating gate has a smaller electron affinity than polycrystalline silicon;

an area of a capacitor formed by the control gate, the floating gate, and the dielectric is larger than an area of a capacitor formed by the floating gate, the silicon dioxide insulator, and the channel region;

the dielectric has a permittivity that is higher than a permittivity of silicon dioxide; and the memory device further comprises:

a refresh circuit to dynamically refresh data stored on the floating gates at a refresh rate, the refresh rate being based on the barrier energy;

a row decoder circuit;

a column decoder circuit;

a voltage control circuit; and command and control circuitry; and the system further comprises control lines, address lines, and data lines coupled between the processor and the memory device.

* * * * *